US011330750B2

(12) United States Patent
Kato

(10) Patent No.: US 11,330,750 B2
(45) Date of Patent: May 10, 2022

(54) ELECTRONIC COMPONENT MOUNTING APPARATUS

(71) Applicant: FUJI CORPORATION, Chiryu (JP)

(72) Inventor: Naohiro Kato, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 177 days.

(21) Appl. No.: 16/620,671

(22) PCT Filed: Jun. 26, 2017

(86) PCT No.: PCT/JP2017/023354
§ 371 (c)(1),
(2) Date: Dec. 9, 2019

(87) PCT Pub. No.: WO2019/003261
PCT Pub. Date: Jan. 3, 2019

(65) Prior Publication Data
US 2021/0144893 A1 May 13, 2021

(51) Int. Cl.
*H05K 13/08* (2006.01)
*H05K 13/04* (2006.01)
(52) U.S. Cl.
CPC ....... *H05K 13/082* (2018.08); *H05K 13/0408* (2013.01)
(58) Field of Classification Search
CPC .................. H05K 13/0408; H05K 13/082
See application file for complete search history.

(56) References Cited

U.S. PATENT DOCUMENTS

| 4,876,791 A | * | 10/1989 | Michaud | ........... H01L 21/67144 |
| | | | | 29/840 |
| 5,010,474 A | * | 4/1991 | Tsuruta | .............. H05K 13/0408 |
| | | | | 700/57 |

(Continued)

FOREIGN PATENT DOCUMENTS

| JP | 2006-165127 A | 6/2006 |
| JP | 2006-313838 A | 11/2006 |
| WO | WO 2017/077594 A1 | 5/2017 |

OTHER PUBLICATIONS

International Search Report dated Aug. 29, 2017 in PCT/JP2017/023354 filed Jun. 26, 2017.

(Continued)

*Primary Examiner* — Carl J Arbes
(74) *Attorney, Agent, or Firm* — Oblon, McClelland, Maier & Neustadt, L.L.P.

(57) ABSTRACT

An electronic component mounting device including a component holding device to hold and mount on a board an electronic component supplied by a component supply device; a motor to drive the component holding device; a motor control device to control the motor; a load measurement device to measure a load applied from the component holding device upon being pressed by the component holding device while the component holding device performs the same operation as when mounting an electronic component on a board, by replacing the board with the load measurement device; a motor information acquisition section to obtain motor information corresponding to the force with which the motor drives the component holding device in the pressing direction against the load measurement device while the motor control device performs the same operation as when mounting an electronic component on the board, by replacing the board with the load measurement device.

10 Claims, 5 Drawing Sheets

(56) References Cited

U.S. PATENT DOCUMENTS

| | | | | |
|---|---|---|---|---|
| 5,285,946 A * | 2/1994 | Tomigashi | ......... | H05K 13/0409 228/9 |
| 5,447,266 A * | 9/1995 | Misono | ............. | H05K 13/0409 228/102 |
| 6,178,621 B1 * | 1/2001 | Shida | ................ | H05K 13/0413 29/740 |
| 6,282,779 B1 * | 9/2001 | Nakano | ............... | H05K 13/082 29/832 |
| 6,289,256 B1 * | 9/2001 | Takeda | ................ | G05B 19/416 29/740 |
| 6,513,233 B1 * | 2/2003 | Nakao | ................. | H05K 13/082 29/740 |
| 7,325,298 B2 * | 2/2008 | Kobayashi | ........... | H05K 13/046 29/740 |
| 8,413,322 B2 * | 4/2013 | Higuchi | ............. | H05K 13/0413 29/832 |
| 8,756,797 B2 * | 6/2014 | Yu | ........................ | G01L 5/0038 29/714 |
| 10,442,149 B2 * | 10/2019 | Nomura | ................ | H02K 11/33 |
| 2005/0105351 A1 | 5/2005 | Kojima | | |
| 2009/0119904 A1 | 5/2009 | Yamasaki et al. | | |
| 2019/0154528 A1 | 5/2019 | Kawaguchi et al. | | |

OTHER PUBLICATIONS

Extended European Search Report dated May 27, 2020 in corresponding European Patent Application No. 17916008.0, 10 pages.

* cited by examiner

ELECTRONIC COMPONENT MOUNTING APPARATUS

TECHNICAL FIELD

The present application relates to an electronic component mounting apparatus.

BACKGROUND ART

Patent Literature 1 discloses a technique of measuring a load received by a load cell when a suction nozzle, installed on a mounting head, is brought into contact with the load cell, and performing load control for adjusting the push-in amount of the suction nozzle so that the measured load reaches a specified target load. Patent Literature 2 discloses a technique of collecting information generated in a mounting process of mounting an electronic component on a board, and analyzing any problems generated in the mounting process based on the collected information.

PATENT LITERATURE

Patent Literature 1: JP-A-2006-313838
Patent Literature 2: JP-A-2006-165127

BRIEF SUMMARY

Technical Problem

In the technique described in Patent Document 1, even if control of the motor is performed such that a load applied to the board from the electronic component held by the suction nozzle reaches a target load, when a problem occurs in the mounting head or the like, the load applied to the board from the suction nozzle may not reach the target load even though the motor generates torque corresponding to the target load. Furthermore, regardless of whether the motor generates torque corresponding to the target load, the load applied to the board from the suction nozzle may exceed the target load. In these cases, there is a possibility the electronic component may be mounted improperly or the electronic component and the board may be damaged. Therefore, detecting an abnormality in a component holding device such as a mounting head is desirable.

It is an object of the present specification to provide an electronic component mounting apparatus capable of detecting abnormalities in a component holding device.

Solution to the Problem

In the present specification discloses an electronic component mounting device comprising: a component holding device configured to hold and mount on a board an electronic component supplied by a component supply device; a motor configured to drive the component holding device; a motor control device configured to control the motor; a load measurement device configured to measure a load applied from the component holding device by being pressed by the component holding device while the component holding device performs the same operation as when mounting an electronic component on a board, by replacing the board with the load measurement device; a motor information acquisition section configured to obtain motor information corresponding to the force of the motor configured to drive the component holding device in the direction in which the component holding device is pressed onto the load measurement device while the motor control device performs the same operation as when mounting an electronic component on the board, by replacing the board with the load measurement device; and a determination section configured to determine whether there is an abnormality by comparing the load measured by the load measurement device and the motor information acquired by the motor information acquisition section.

According to the present disclosure, the determination section determines whether there is an abnormality in the component holding device by comparing the load measured by the load measurement device with the motor information acquired by the motor information acquisition section. Here, the load measured by the load measurement device corresponds to the load actually applied to the board by the component holding device. On the other hand, the motor information relating to driving of the motor by the motor control device corresponds to the force with which the motor drives the component holding device in the direction of pressing against the load measurement device. That is, the motor information corresponds not to the load actually applied to the board by the component holding device but an estimated value of the load. If the component holding device is normal, the load measured by the load measurement device matches or correlates with the motor information. On the other hand, if there is an abnormality in the component holding device, the load measured by the load measurement device and the motor information do not match or have no correlation. Therefore, the determination section can detect whether the component holding device has an abnormality by comparing the load measured by the load measurement device with the motor information.

DESCRIPTION OF EMBODIMENTS

1. First Embodiment 1-1: Configuration of Electronic Component Mounting Apparatus 1

Electronic component mounting device 1 is a production device for mounting electronic components on circuit board 90 to produce a board product. Hereinafter, the "electronic component mounting apparatus" is referred to as a "component mounting apparatus", and the electronic component is simply referred to as a "component".

Figure 1:
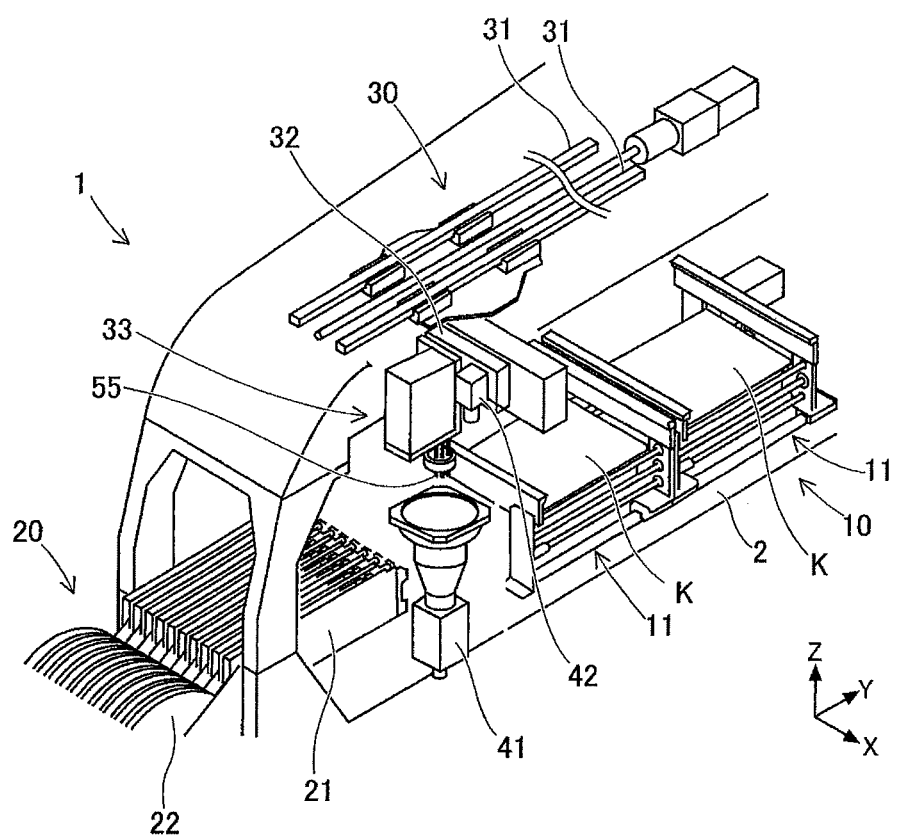
FIG. 1 is a perspective view of an electronic component mounting apparatus of a first embodiment of the present specification.
Figure 3:
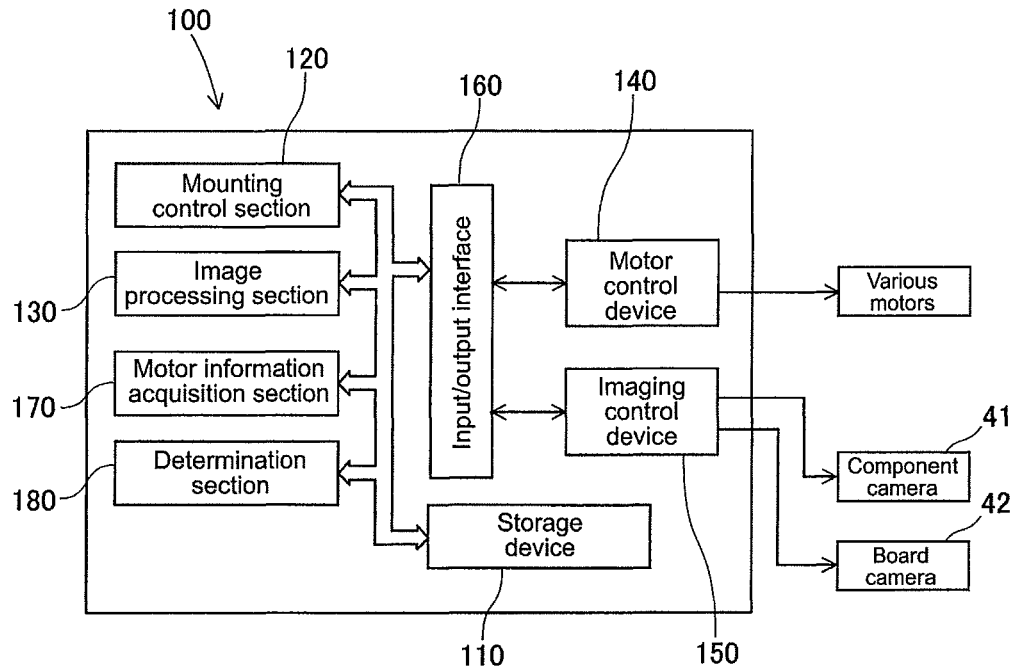
FIG. 3 is a block diagram of a control device.

As shown in FIG. 1, component mounting apparatus 1 mainly includes board conveyance device 10, component supply device 20, component holding device 30, component camera 41, board camera 42, and control device 100 (refer to FIG. 3). In the following description, the horizontal width direction (i.e., the direction from the upper left to the lower right in FIG. 1) of component mounting device 1 is taken as the X-axis direction, and the horizontal longitudinal direction (i.e., the direction from the lower left to the upper right in FIG. 1) of component mounting device 1 is taken as the Y-axis direction, and the vertical direction (i.e., the up-down direction in FIG. 1) perpendicular to the X-axis direction and the Y-axis direction is taken as the Z-axis direction.

Board conveyance device 10 is configured by a belt conveyor or the like, and sequentially conveys board K, to which a component is to be mounted, in the conveyance direction (X-axis direction). Board conveyance device 10 includes two conveyance mechanisms 11 arranged in parallel in the Y-axis direction with respect to base 2. Conveyance mechanism 11 conveys board K into component mounting apparatus 1 and positions board K at a predetermined position in the machine to bring board K into a clamped state. After mounting of the components by component mounting apparatus 1 is completed, board conveyance device 10 releases the clamped state and conveys board K to the outside of component mounting apparatus 1.

Component supply device 20 supplies components to be mounted on board K. Component supply device 20 includes multiple slots arranged in the X-axis direction. Further, component supply device 20 includes multiple feeders 21 that are interchangeably set in each of the multiple slots. Each feeder 21 feeds a carrier tape wound on reel 22 to supply components accommodated in the carrier tape to a supply position provided on the distal end of feeder 21, that is, on the upper right side in FIG. 1.

Component holding device 30 collects a component supplied to the supply position and attaches the collected component to positioned board K. Component holding device 30 mainly includes head driving device 31, moving body 32, and mounting head 33. Head driving device 31 is configured to move moving body 32 in the X-axis direction and the Y-axis direction with a linear movement mechanism. Mounting head 33 is detachably provided to moving body 32 and is configured to hold a component supplied to the supply position. A detailed configuration of mounting head 33 will be described later.

Component camera 41 and board camera 42 are digital imaging devices having imaging elements such as a CCD (Charge Coupled Device) and a CMOS (Complementary Metal Oxide Semiconductor). Component camera 41 and board camera 42 image a range that falls within the camera field of view, based on a control signal from control device 100 connected in a communicable manner, and transmit image data acquired by the imaging to control device 100. Component camera 41 is fixed to the base of component mounting apparatus 1 so that the optical axis is in the Z-axis direction, and captures an image of the component, held by mounting head 33, from below. Board camera 42 is fixed to moving body 32 so that the optical axis is in the Z-axis direction, and images board K from above.

Control device 100 mainly includes a CPU, various types of memory, and a control circuit. Control device 100 performs control for mounting a component on board K based on a control program for operating component mounting device 1 and image data acquired by imaging with component camera 41 and board camera 42.

1-2: Configuration of Mounting Head 33

Figure 2:
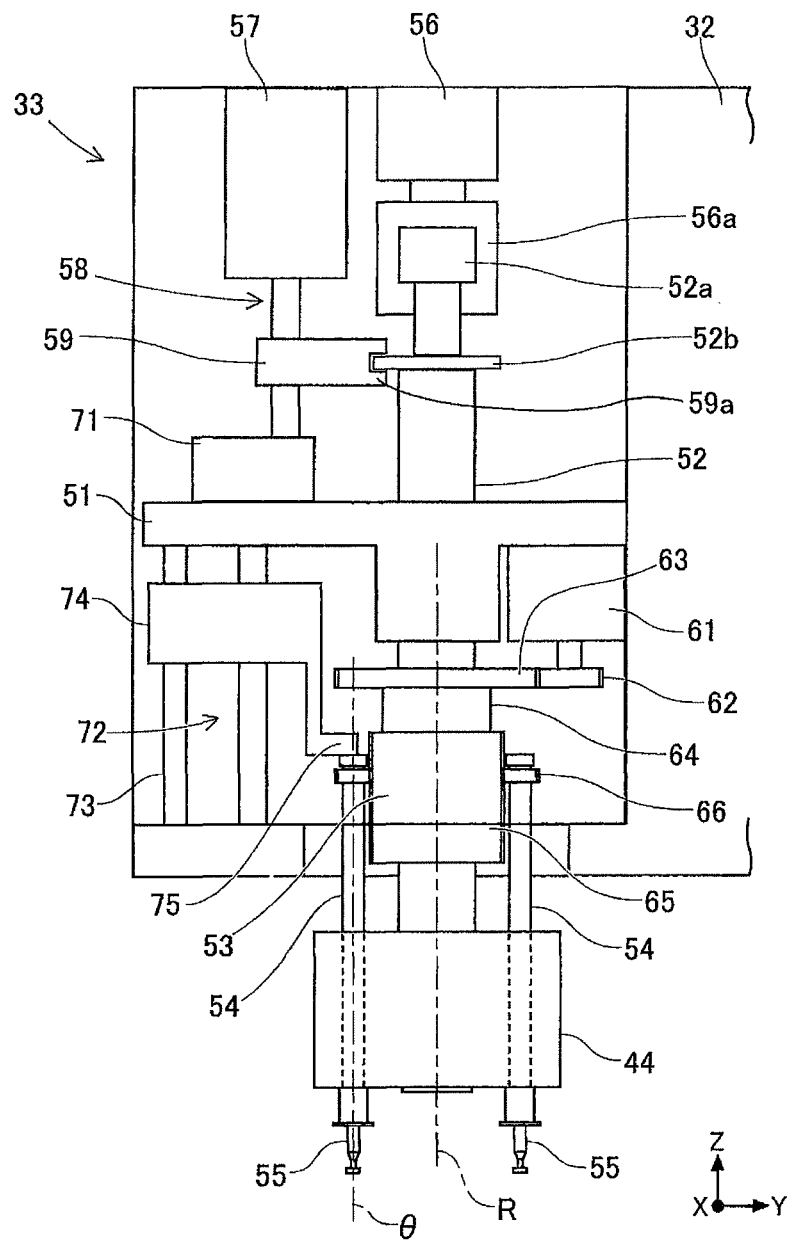
FIG. 2 is a diagram showing a configuration of a mounting head.

Next, a detailed configuration of mounting head 33 will be described. As shown in FIG. 2, mounting head 33 mainly includes head main body 51, index shaft 52, rotary head 53, multiple nozzle shafts 54, and multiple suction nozzles 55.

Head main body 51 is detachably attached to moving body 32. Index shaft 52 is supported rotatably and vertically with respect to head main body 51. Rotary head 53 is fixed to the lower end of index shaft 52. Multiple nozzle shafts 54 are arranged at equal intervals in the circumferential direction on a circumference concentric with the axis (i.e., the R-axis) of index shaft 52. Each of multiple nozzle shafts 54 are supported by rotary head 53 so as to be slidable in the Z-axis direction and rotatable about the axis (i.e., the θ-axis) of nozzle shaft 54. Nozzle shaft 54 is provided with a spring (not shown), and nozzle shaft 54 is urged upward with respect to rotary head 53 by the elastic force of a spring. As a result, nozzle shaft 54 is positioned at a lifted end state in which no external force is applied. Multiple suction nozzles 55 are component holding sections that are detachably attached to the lower ends of the multiple nozzle shafts 54.

Mounting head 33 further includes R-axis motor 56, Z1-axis motor 57, first ball screw mechanism 58, and lifting and lowering member 59. R-axis gear 56a is provided at the lower end of R-axis motor 56, and R-axis gear 56a engages with index gear 52a provided at the upper end of index shaft 52. Index shaft 52 is driven by R-axis motor 56 to rotate, and the rotation angle is determined at every predetermined angle. Rotary head 53 is rotated by driving index shaft 52 by R-axis motor 56, and suction nozzles 55 are sequentially indexed to predetermined angular positions around the R-axis.

Z1-axis motor 57 is fixed to head main body 51, and first ball screw mechanism 58 is driven by Z1-axis motor 57. Lifting and lowering member 59 is driven by first ball screw mechanism 58 to move up and down in the Z-axis direction. Lifting and lowering member 59 includes engaging section 59a that engages with flange section 52b on index shaft 52, and index shaft 52 moves up and down in the Z-axis direction as lifting and lowering member 59 moves up and down. Rotary head 53 and suction nozzle 55 move up and down as index shaft 52 moves up and down.

Mounting head 33 further includes θ-axis motor 61, driving gear 62, driven gear 63, rotating body 64, θ-axis gear 65, and multiple nozzle gears 66. θ-axis motor 61 is fixed to head main body 51, and driving gear 62 is provided on the output shaft of θ-axis motor 61. Driven gear 63 is provided at the upper end of rotating body 64 and engages with driving gear 62. θ-axis gear 65 is provided at the lower end of rotating body 64 and rotates integrally with rotating body 64. θ-axis gear 65 meshes with nozzle gear 66 provided at the upper end of each multiple nozzle shaft 54. With such a configuration, multiple nozzle shafts 54 and multiple suction nozzles 55 are integrally rotated around the θ-axis by the driving of θ-axis motor 61, and the rotation angle and the rotation speed are controlled.

In addition, mounting head 33 further includes Z2-axis motor 71, second ball screw mechanism 72, guide bar 73, nozzle operating member 74, and nozzle lever 75. Z2-axis motor 71 is fixed to head body 51, and second ball screw mechanism 72 is driven by Z2-axis motor 71. Guide bars 73 are rod-shaped members extending in the Z-axis direction, and both ends of guide bars 73 are fixed to head main body 51. Nozzle operating member 74 is slidably provided on guide bars 73, and moves up and down in the Z-axis direction by being driven by second ball screw mechanism 72 while being guided by guide bars 73.

Nozzle lever 75 is a portion of the multiple nozzle shafts 54 in contact with the upper end of one of indexed nozzle shafts 54, and is integrally formed with nozzle operating member 74. When nozzle lever 75 descends along with the downward movement of nozzle operating member 74 in the Z-axis direction, one nozzle shaft 54 is pressed downward in the Z-axis direction, and descends against the biasing force of a spring (not shown). On the other hand, when nozzle lever 75 rises along with the upward movement of nozzle operating member 74 in the Z-axis direction, nozzle shaft 54 rises by being biased by the spring. With such a configuration, multiple nozzle shafts 54 and multiple suction nozzles 55 are moved up and down in the Z-axis direction by driving Z2-axis motor 71, and the position and the moving speed in the Z-axis direction are controlled.

1-3: Control Device 100

Next, control device 100 will be described with reference to FIG. 3. As shown in FIG. 3, control device 100 includes storage device 110, mounting control section 120, image processing section 130, motor control device 140, imaging control device 150, and input/output interface 160. Storage device 110, mounting control section 120, and image processing section 130 are connected to motor control device 140 and imaging control device 150 via input/output interface 160, and input/output interface 160 converts the data format and adjusts the signal strength.

Storage device 110 is configured by an optical drive device such as a hard disk drive, a flash memory, or the like. Storage device 110 stores a control program, control information, image data, and the like.

Mounting control section 120 controls the position of mounting head 33 and the position and rotation angle of suction nozzle 55 supported by mounting head 33 via motor control device 140. Specifically, mounting control section 120 receives information outputted from various sensors provided in component mounting apparatus 1, results of various recognition processes, and the like. Mounting control section 120 then transmits a control signal to motor control device 140 based on the control program and the control information stored in storage device 110, the information from the various sensors, and the results of image processing and recognition processing. Image processing section 130 acquires image data captured with component camera 41 and board camera 42, and executes image processing according to the application.

Motor control device 140 feedback-controls the driving of the various motors provided in component holding device 30 based on the control signal received from mounting control section 120. Imaging control device 150 controls imaging by component camera 41 and board camera 42 based on a control signal received from the CPU or the like of control device 100. Imaging control device 150 acquires image data obtained by imaging with component camera 41 and board camera 42, and stores the acquired image data in storage device 110.

1-4: Details of Motor Control Device 140

Next, motor control device 140 will be described. Motor control device 140 controls various motors provided in head driving device 31 and moves moving body 32 in a horizontal direction (X-axis direction and Y-axis direction) to move mounting head 33 above board K. Thereafter, motor control device 140 drives Z1-axis motor 57 and Z2-axis motor 71 to lower suction nozzle 55 along the Z-axis direction and mount the component on board K.

When the component is mounted on board K, board K receives an impact by coming into contact with the component. On the other hand, in order to securely mount the component on board K, it is desirable for the component to be pressed against board K by suction nozzle 55. Therefore, motor control device 140 controls the drive of Z2-axis motor 71 to adjust the force with which suction nozzle 55 presses the component against board K, thereby preventing an excessive load from being applied to board K. Hereinafter, the control of Z2-axis motor 71 performed by motor control device 140 will be described.

Figure 4:
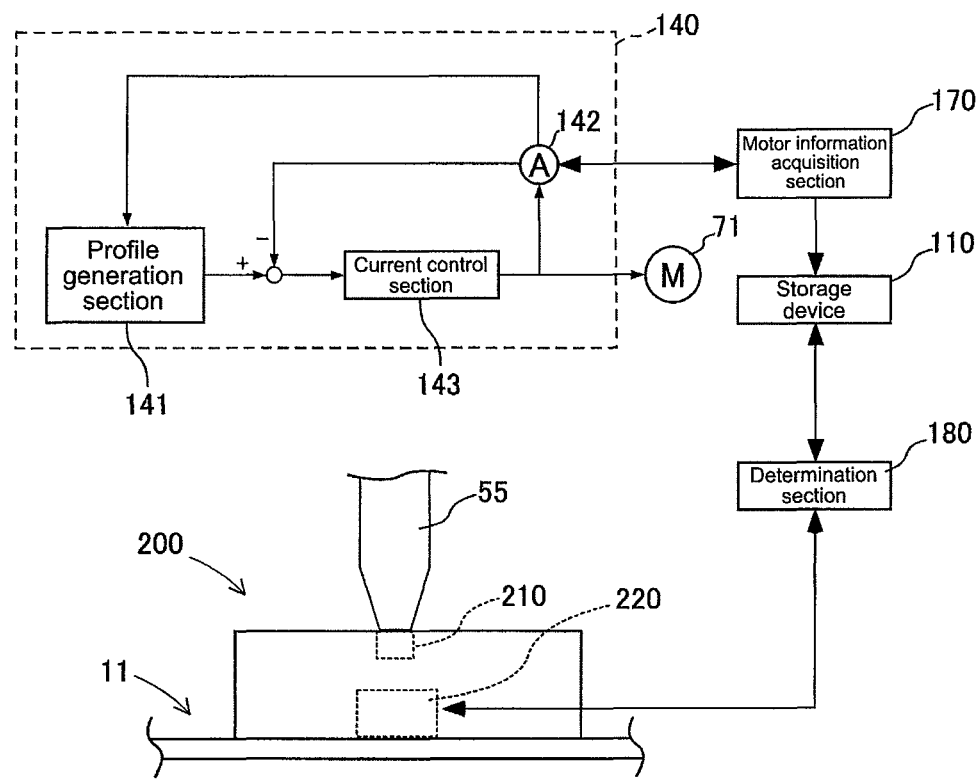
FIG. 4 is a block diagram of a motor control device.
Figure 5:
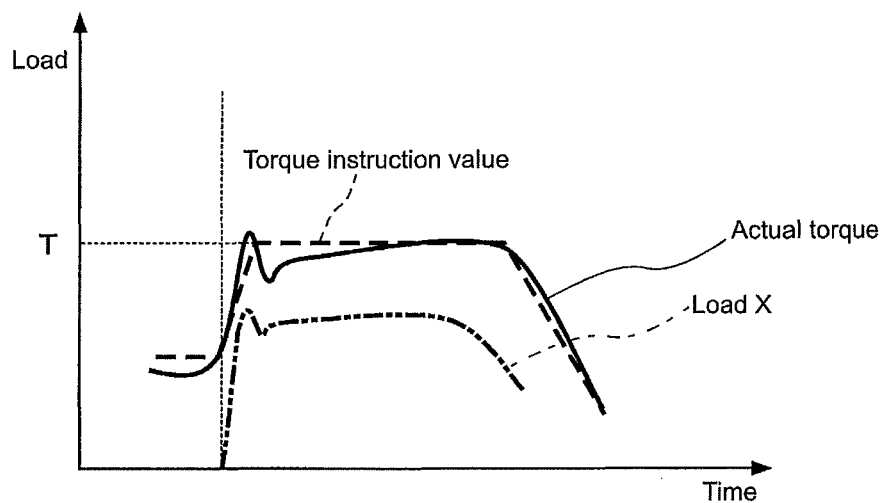
FIG. 5 is a graph showing a comparison between progressions of loads measured in the load measurement device and a progression of actual torque generated by a Z2-axis motor.

As shown in FIGS. 4 and 5, motor control device 140 mainly includes profile generation section 141, current detector 142, and current control section 143. Profile generation section 141 generates a torque instruction for Z2-axis motor 71, based on a movement instruction from mounting control section 120, and transmits to current control section 143 the torque instruction value corresponding to the mounting operation of the component by mounting head 33.

Current detector 142 detects the motor current generated by Z2-axis motor 71 and feeds back the detected value to current control section 143. Current control section 143 generates a drive signal of a power converter (not shown) for driving Z2-axis motor 71 based on a deviation between the torque instruction value from profile generation section 141 and the actual torque obtained from the detected value of the actual current that is fed back from current detector 142. The power converter is, for example, an inverter and supplies a motor current, based on a calculation result, to Z2-axis motor 71 to drive Z2-axis motor 71. Profile generation section 141 acquires the detected value of the actual current from current detector 142 and adjusts the torque instruction value based on the progression of the actual torque obtained from the acquired detected value.

In this manner, motor control device 140 controls Z2-axis motor 71 based on the actual torque generated by Z2-axis motor 71 and the torque instruction value of Z2-axis motor 71 transmitted from profile generation section 141 when component holding device 30 mounts the component to board K.

In this case, in the present embodiment, profile generation section 141 may transmit the current instruction value corresponding to the torque instruction value to current control section 143, and current control section 143 may generate the drive signal of the power converter from the deviation between the current instruction value transmitted from profile generation section 141 and the actual current fed back from current detector 142.

1-5: Determination of Abnormality in Component Holding Device 30 with Load Measurement Device 200

It is desirable for the operator to periodically carry out maintenance of component mounting device 1 and inspect whether there is an abnormality in component holding device 30. For example, when nozzle shaft 54 is deformed or dust adheres to nozzle shaft 54, sliding resistance generated by the lifting operation of nozzle shaft 54 increases. In this case, even if an appropriate load is applied from Z2-axis motor 71 to nozzle shaft 54 by feedback control, nozzle shaft 54 does not slide smoothly and decreases the force with which suction nozzle 55 presses a component against board K. As a result, the component to be mounted does not sufficiently bond to board K thereby potentially causing a problem in which a component detaches from board K.

In this regard, component mounting apparatus 1 further includes load measurement device 200 used for determining whether there is an abnormality in component holding device 30. Control device 100 includes motor information acquisition section 170 for acquiring motor information related to driving of Z2-axis motor 71, and determination section 180 for determining where there is an abnormality in component holding device 30 by comparing the load measured by load measurement device 200 with the motor information acquired by motor information acquisition section 170. It should be noted that the motor information is information corresponding to the force by which Z2-axis motor 71 drives the component in the direction in which the component is pressed against board K by suction nozzle 55 when the component is being mounted on board K. That is, the motor information does not correspond to the load actually applied to board K by component holding device 30 but corresponds to an estimated value of the load.

Component mounting device 1 performs the same operation as the operation by which component holding device 30 mounts a component to board K but on load measurement device 200 instead of board K. Determination section 180 then compares the load measured by load measurement device 200 with the actual torque generated by Z2-axis motor 71 at this time and determines whether an abnormality has occurred in component holding device 30 based on the comparison result. The load measured by load measurement device 200 corresponds to the load actually applied to board K by component holding device 30.

As shown in FIG. 4, load measurement device 200 includes load sensor 210 and load memory 220. Load sensor 210 measures the load applied from component holding device 30 by being pressed by component holding device 30, and load memory 220 stores the progression of the load measured by load sensor 210.

When the abnormality determination of component holding device 30 is performed, the operator conveys load measurement device 200 by conveying mechanism 11 of board conveyance device 10 and positions load measurement device 200. Thereafter, component mounting device 1 performs the same operation as when mounting a component on board K with component holding device 30 (see FIG. 1) but on load measurement device 200 instead of board K, so that component mounting device 1 performs on load measurement device 200 the same operation as when mounting a component on board K.

That is, at the time of component mounting, component holding device 30 drives Z1-axis motor 57 and Z2-axis motor 71 to lower suction nozzle 55 in a state in which mounting head 33 (refer to FIG. 2) is moved above load measurement device 200. When the component comes into contact with board K, component holding device 30 increases the torque instruction value of Z2-axis motor 71 so as to press the component against board K for a while and then lifts suction nozzle 55. Component mounting device 1 performs such a series of mounting operations on load measurement device 200 to inspect whether a load corresponding to the torque instruction of Z2-axis motor 71 is applied to load measurement device 200. Component holding device 30 performs the above-described series of mounting operations for all nozzle shafts 54 and suction nozzles 55 provided in mounting head 33 multiple times for each of nozzle shafts 54 and suction nozzles 55. Load measurement device 200 then stores the progression data of the loads measured by load sensor 210 in load memory 220.

On the other hand, motor information acquisition section 170 acquires the motor information when performing the same operation as the operation in which the component holding device 30 mounts a component to board K but on load measurement device 200 instead of board K. The motor information in the present embodiment is information on the progression of the actual torque generated by Z2-axis motor 71 when component holding device 30 performs the series of mounting operations on load measurement device 200. More specifically, motor information acquisition section 170 converts the actual current shift data of Z2-axis motor 71 detected by current detector 142 into actual torque shift data and stores the converted actual torque shift data in storage device 110.

Determination section 180 acquires the shift data of the loads stored in load memory 220 and the shift data for the actual torques stored in storage device 110, and compares them. When the load measured by load sensor 210 is lower than a threshold value calculated based on the actual torque, determination section 180 determines that component holding device 30 has an abnormality.

FIG. 5 is a graph showing a comparison between the progression of the torque instruction value and the progression of the load measured by load measurement device 200. As shown in FIG. 5, since Z2-axis motor 71 is feedback-controlled based on the actual torque and the torque instruction value, the progression of the actual torque substantially coincides with the progression of the torque instruction value. In addition, although the actual torque temporarily increases when suction nozzle 55 comes into contact with load measurement device 200 and the difference from the torque instruction value increases, motor control device 140 controls the actual torque to approximate the torque instruction value by performing feedback control.

Motor control device 140 controls various motors provided in head driving device 31, moves mounting head 33 above load measurement device 200, and then controls Z1-axis motor 57 and Z2-axis motor 71 to lower suction nozzle 55. At this time, the torque instruction value of Z2-axis motor 71 given by profile generation section 141 to current control section 143 is constant until suction nozzle 55 comes into contact with load measurement device 200. The actual torque generated in Z2-axis motor 71 at this time is mainly a reaction force of a force acting on suction nozzle 55 by compression of a spring (not shown) provided to nozzle shaft 54.

Thereafter, when suction nozzle 55 comes into contact with load sensor 210, the actual torque rapidly increases due to the reaction force acting on suction nozzle 55 from load measurement device 200. When the actual torque rises above a predetermined threshold, profile generation section 141 determines that the component has contacted board K and increases the torque instruction value transmitted to current control section 143 until the target torque T is reached. When the torque instruction value reaches the target torque T, profile generation section 141 maintains the torque instruction value at target torque T for a while.

The target torque T is a target value of the actual torque applied by component holding device 30 when suction nozzle 55 presses the component against board K at the time of mounting a component, and component holding device 30 maintains the state in which the component is pressed against board K while the torque instruction value is set at the target torque T. Profile generation section 141 releases the holding state of the component and lifts suction nozzle 55 when a predetermined time has elapsed while the actual torque reaches the target torque T. Specifically, mounting head 33 releases the supply of negative pressure air to suction nozzle 55 from a negative pressure supply device (not shown), releases the holding of the component by suction nozzle 55 and lifts suction nozzle 55 by driving Z1-axis motor 57 and Z2-axis motor 71.

If component holding device 30 is normal and the sliding resistance generated by lifting nozzle shaft 54 is small, the progression of the load measured by load measurement device 200 will match or correlate with the progression of the motor information, that is, the actual torque. On the other hand, if component holding device 30 has an abnormality, the load measured by the load measurement device and the motor information will not match or will have no correlation.

For example, when the sliding resistance of nozzle shaft 54 is high, such as load X indicated by the two-dot chain line in FIG. 5, the load applied from Z2-axis motor 71 to nozzle shaft 54 decreases due to the torque loss caused by the sliding resistance of nozzle shaft 54 and the load measured by load measurement device 200 becomes smaller than the actual torque. Therefore, determination section 180 compares the load measured by the load measurement device with the motor information, and when the measured load is lower than the threshold value calculated based on the actual torque, determination section 180 determines that there is an abnormality in component holding device 30.

Further, determination section 180 determines that component holding device 30 has an abnormality when a temporal deviation occurs between the progression of the actual torque and the progression of the load, for example, when a time lag between the time when the actual torque reaches the target torque T and the time when the load reaches the target torque T is large. Determination section 180 displays the determination result on an operation panel or the like.

In performing the abnormality determination here, while it is determined that there is an abnormality in component holding device 30 in an inspection using one nozzle shaft 54 and suction nozzle 55, there are cases in which it is determined that there is no abnormality in component holding device 30 in inspections using other nozzle shafts 54 and suction nozzles 55. In these cases, when it is determined that there is an abnormality, the operator can surmise that there is a high probability that an abnormality has occurred in one of nozzle shafts 54 and suction nozzles 55 used. On the other hand, when multiple nozzle shafts 54 and suction nozzles 55 are determined to have an abnormality, the operator can surmise that there is a high probability that an abnormality has occurred in a portion other than nozzle shafts 54 and suction nozzles 55, for example, Z2-axis motor 71.

As described above, determination section 180 determines whether there is an abnormality in component holding device 30 by comparing the load measured by load measurement device 200 with the motor information acquired by motor information acquisition section 170. As a result, the operator can detect an abnormality of component holding device 30 in component mounting apparatus 1 having mounting head 33 and suction nozzle 55, and having component holding device 30 that drives mounting head 33 and suction nozzle 55 with Z2-axis motor 71.

Further, motor control device 140 controls Z2-axis motor 71 based on the torque instruction value of Z2-axis motor 71 from profile generation section 141 and the actual torque generated by Z2-axis motor 71 when component holding device 30 mounts a component on board K. Motor information acquisition section 170 then acquires the actual torque used by motor control device 140 to control Z2-axis motor 71 as motor information and determination section 180 compares the motor information obtained from the actual torque with the load and performs an abnormality determination of component holding device 30. That is, since component mounting apparatus 1 uses the data relating to the actual torque used for feedback control of Z2-axis motor 71 for the abnormality determination of component holding device 30, the control load of control device 100 can be reduced because it is not necessary to additionally acquire the data used for the abnormality determination.

2. Second Embodiment

Next, a second embodiment will be described. In the first embodiment, determination section 180 determines whether there is an abnormality in component holding device 30 by comparing the motor information, obtained based on the actual torque generated by the Z-axis motor, with the load. On the other hand, in the second embodiment, the abnormality determination of component holding device 30 is performed by comparing the motor information, obtained from the torque instruction value calculated based on the positional deviation between the actual position of component holding device 30 and the instructed position of component holding device 30, with the load. Note that components identical to those of the first embodiment are denoted by the same reference numerals and descriptions thereof are omitted.

2-1: Motor Control Device 440

In the present embodiment, motor control device 440 calculates the torque instruction value based on the positional deviation between the actual position of component holding device 30 and the instructed position of component holding device 30 at the time of mounting the component by component holding device 30, and supplies a current obtained from the torque instruction value to Z2-axis motor 71.

Figure 6:
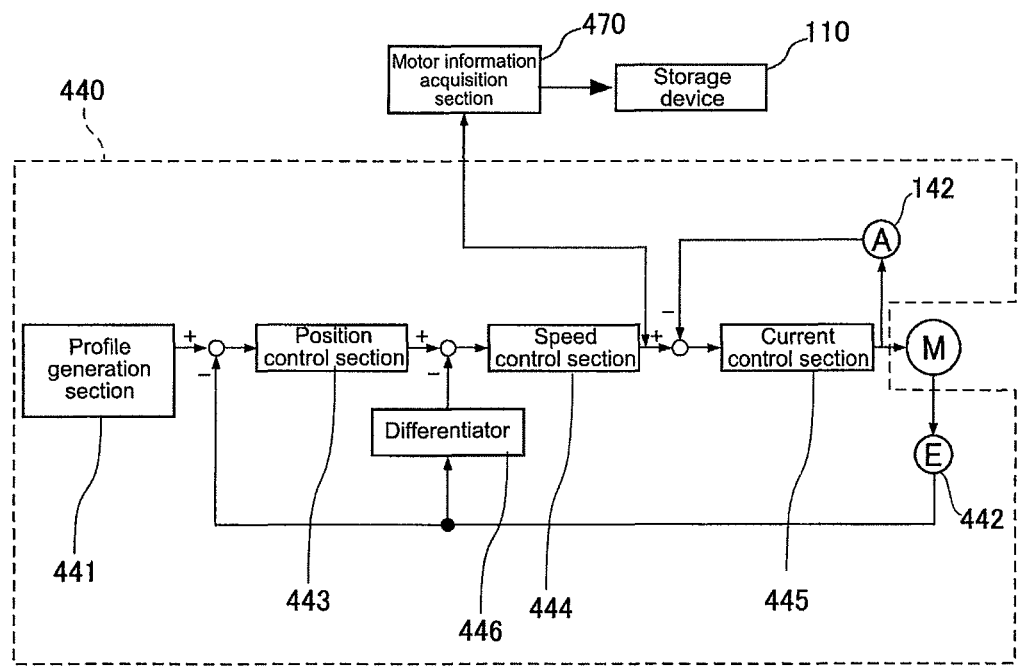
FIG. 6 is a block diagram of a motor control device in a second embodiment.

As shown in FIG. 6, motor control device 440 according to the second embodiment includes profile generation section 441, rotation detection device 442, position control section 443, speed control section 444, current control section 445, differentiator 446, and current detector 142.

Profile generation section 441 generates a position instruction for Z2-axis motor 71 based on the position instruction from mounting control section 120. Rotation detection device 442 detects rotation phase information of Z2-axis motor 71. Position control section 443 generates a speed instruction based on the positional deviation between the instructed position (i.e., position instruction value) from profile generation section 441 and the actual position obtained from rotation phase information from rotation detection device 442.

Differentiator 446 (mathematically) differentiates the actual position obtained from rotation detection device 442 to obtain the speed information of Z2-axis motor 71. Speed control section 444 generates a torque instruction based on the deviation between the speed instruction value, from position control section 443, and speed information from Z2-axis motor 71. Current control section 445 generates a drive signal of a power converter (not shown) for driving Z2-axis motor 71 from the deviation between the torque instruction value from speed control section 444 and the actual torque obtained from the detected value of the actual current that is fed back from current detector 142.

The speed information of Z2-axis motor 71 can be calculated, for example, from the frequency of the rotation phase information. Current control section 445 generates a drive signal of the power converter based on the deviation between the torque instruction value from speed control unit 444 and the actual current detected by current detector 142.

2-2: Abnormality Determination of Component Holding Device 30 by Load Measurement Device 200

In the present embodiment, motor information acquisition section 470 acquires motor information obtained from the torque instruction value for Z2-axis motor 71 from motor control device 140. That is, motor information acquisition section 470 acquires motor information obtained from the torque instruction value outputted by speed control section 444. Motor information acquisition section 470 then stores progression data of the torque instruction value serving as motor information in storage device 110.

Determination section 180 acquires progression data of the load stored in load memory 220 and progression data of the torque instruction value stored in storage device 110, and compares them. When the load measured by load sensor 210 exceeds a threshold value calculated based on the torque instruction value, determination section 180 determines that component holding device 30 has an abnormality.

Figure 7:
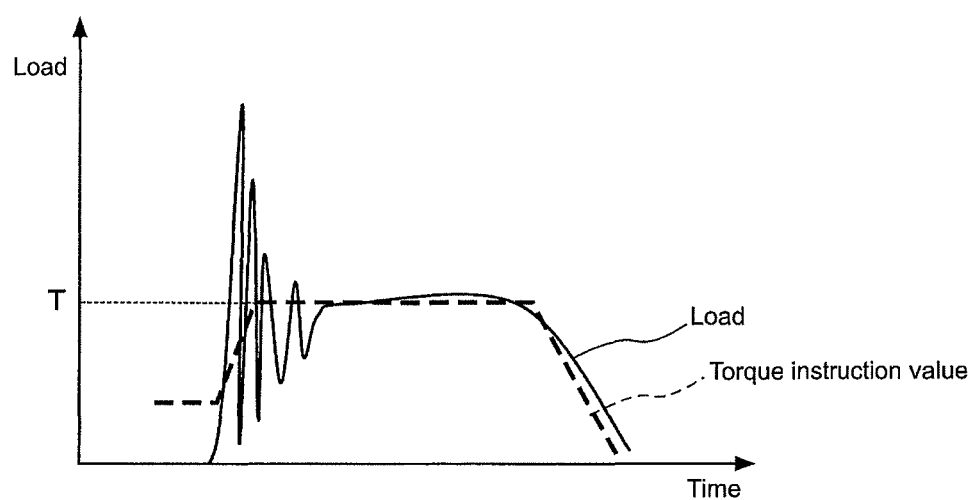
FIG. 7 is a graph showing a comparison between the progression of a load measured by a load measurement device and the progression of a torque instruction value to a Z2-axis motor.

FIG. 7 is a graph showing a comparison between the progression of the torque instruction value and the progression of the load measured by load measurement device 200. As shown in FIG. 7, when suction nozzle 55 comes into contact with load measurement device 200, a vibration is generated in suction nozzle 55 such that the positional deviation between the actual position and the instruction position, from profile generation section 441, temporarily increases.

In this case, when the sliding resistance generated by lifting nozzle shaft 54 is large, the torque required to lower nozzle shaft 54 and suction nozzle 55 becomes large compared with the case where the sliding resistance is small. Therefore, when the sliding resistance generated by lifting nozzle shaft 54 is large at the time of mounting a component, the impact on board K when the component and board K come in contact with each other becomes large, and the component and board K are more likely to be damaged.

Therefore, in the abnormality determination of component holding device 30 by load measurement device 200, when the load measured by load measurement device 200, at the time of contact with suction nozzle 55, is large and the deflection range of the load accompanying the feedback control of Z2-axis motor 71 exceeds a predetermined threshold, determination section 180 determines that an abnormality has occurred in component holding device 30. When the time required for the load measured by load measurement device 200 to converge to the target torque T is long, determination section 180 determines that component holding device 30 has an abnormality.

In this manner, motor control device 440 calculates a torque instruction value based on the positional deviation between the actual position of component holding device 30 and the instruction position of component holding device 30, and supplies a current (i.e., a current instruction), obtained from the calculated torque instruction value, to Z2-axis motor 71. Motor information acquisition section 470 acquires the torque instruction value used by motor control device 440 for position control of Z2-axis motor 71 as motor information, and determination section 180 compares the motor information, obtained from the torque instruction value, with the load, and performs an abnormality determination of component holding device 30. That is, since component mounting apparatus 1 uses data relating to the torque instruction value used for feedback control of Z2-axis motor 71 in determining whether there is an abnormality in component holding device 30, it is unnecessary to further acquire data for the abnormality determination, thereby reducing the control burden on control device 100.

3. Other

Although the present disclosure has been described based on the above-described embodiments, the present disclosure is not limited to the above-described embodiments, and it can be easily inferred that various modifications and improvements can be made within a range not departing from the spirit of the present disclosure.

For example, in each of the embodiments described above, the case where component mounting device 1 conveys load measurement device 200 by conveyance mechanism 11 and performs positioning has been described as an example, but load measurement device 200 may be provided inside component mounting device 1.

Further, in the second embodiment, a case where motor information acquisition section 470 acquires motor information obtained from the torque instruction value for Z2-axis motor 71 has been described, but as in the first embodiment, the actual torque (i.e., the actual current) generated by Z2-axis motor 71 may be acquired as motor information.

REFERENCE SIGNS LIST

1: Electronic component mounting apparatus (component mounting apparatus), 20: Component supply device, 30: Component holding device, 33: Mounting head, 55: Suction nozzle (component holding section), 71: Z2-axis motor (motor), 140, 440: Motor control device, 170, 470: Motor information acquisition section, 180: Determination section, 200: Load measurement device

The invention claimed is:

1. An electronic component mounting device, comprising:
   a component holding device configured to hold and mount on a board an electronic component supplied by a component supply device;
   a motor configured to drive the component holding device;
   a motor control device configured to control the motor;
   a load measurement device configured to replace the board and measure a load applied from the component holding device upon being pressed by the component holding device while the component holding device performs an operation that is the same operation as when mounting the electronic component on the board, the operation being performed when the board is replaced with the load measurement device; and
   control circuitry programmed to:
      obtain motor information corresponding to a force, with which the motor drives the component holding device in a pressing direction against the load measurement device, while the component holding device performs the operation, the motor information being related to driving the motor with the motor control device, and
      determine whether there is an abnormality by comparing the load measured by the load measurement device and the motor information.

2. The electronic component mounting device of claim 1, wherein the control circuitry is programmed to:
   acquire from the motor control device the motor information obtained based on actual torque generated by the motor, and
   determine whether there is an abnormality in the component holding device by comparing the load with the motor information obtained based on the actual torque.

3. The electronic component mounting device of claim 2, wherein the motor control device is configured to control the motor based on the actual torque generated by the motor and a torque instruction value of the motor when the component holding device mounts the electronic component to the board.

4. The electronic component mounting device of claim 1, wherein
   when the component holding device mounts the electronic component to the board, the motor control device is configured to:

calculate a torque instruction value based on a positional deviation between an actual position of the component holding device and an instructed position of the component holding device, and supply a current obtained from the torque instruction value to the motor, and the control circuitry is programmed to:

acquire motor information based on the torque instruction value for the motor from the motor control device, and determine whether there is an abnormality in the component holding device by comparing the load with the motor information acquired based on the torque instruction value.

5. The electronic component mounting device of claim 1, wherein the component holding device includes:

a component holding section configured to come into contact with and hold the electronic component, and a mounting head configured to support the component holding section in a manner which allows the component holding section to move up and down; and the motor is configured to drive the mounting head.

6. A system, comprising:

an electronic component mounting device including:

a component holding device configured to hold and mount on a board an electronic component supplied by a component supply device;

a motor configured to drive the component holding device;

a motor control device configured to control the motor; and a load measurement device configured to replace the board and measure a load applied from the component holding device upon being pressed by the component holding device while the component holding device performs an operation that is the same operation as when mounting the electronic component on the board, the operation being performed when the board is replaced with the load measurement device, and control circuitry programmed to:

obtain motor information corresponding to a force, with which the motor drives the component holding device in a pressing direction against the load measurement device, while the component holding device performs the operation, the motor information being related to driving the motor with the motor control device; and determine whether there is an abnormality by comparing the load measured by the load measurement device and the motor information.

7. The system of claim 6, wherein the control circuitry is programmed to:

acquire from the motor control device the motor information obtained based on actual torque generated by the motor; and determine whether there is an abnormality in the component holding device by comparing the load with the motor information obtained based on the actual torque.

8. The system of claim 7, wherein the motor control device is configured to control the motor based on the actual torque generated by the motor and a torque instruction value of the motor when the component holding device mounts the electronic component to the board.

9. The system of claim 6, wherein when the component holding device mounts the electronic component to the board, the motor control device is configured to:

calculate a torque instruction value based on a positional deviation between an actual position of the component holding device and an instructed position of the component holding device, and supply a current obtained from the torque instruction value to the motor, and the control circuitry is programmed to:

acquire motor information based on the torque instruction value for the motor from the motor control device, and determine whether there is an abnormality in the component holding device by comparing the load with the motor information acquired based on the torque instruction value.

10. The system of claim 6, wherein the component holding device includes a component holding section configured to come into contact with and hold the electronic component, and a mounting head configured to support the component holding section in a manner which allows the component holding section to move up and down; and the motor is configured to drive the mounting head.

* * * * *